(12) United States Patent
Suwa et al.

(10) Patent No.: US 9,136,200 B2
(45) Date of Patent: Sep. 15, 2015

(54) HEAT RADIATING COMPONENT AND METHOD OF PRODUCING SAME

(75) Inventors: Yoriyuki Suwa, Nagano (JP); Kenji Kawamura, Nagano (JP); Syuzo Aoki, Nagano (JP); Masao Nakazawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 787 days.

(21) Appl. No.: 13/228,992

(22) Filed: Sep. 9, 2011

(65) Prior Publication Data

US 2012/0064361 A1 Mar. 15, 2012

(30) Foreign Application Priority Data

Sep. 14, 2010 (JP) .................... 2010-205631
Aug. 3, 2011 (JP) .................... 2011-170156

(51) Int. Cl.
| | | |
|---|---|---|
| *B32B 15/00* | (2006.01) | |
| *H01L 23/00* | (2006.01) | |
| *H01L 23/373* | (2006.01) | |
| *B32B 15/01* | (2006.01) | |
| *B82Y 30/00* | (2011.01) | |
| *C23C 28/02* | (2006.01) | |
| *C23C 28/00* | (2006.01) | |

(52) U.S. Cl.
CPC ............. *H01L 23/373* (2013.01); *B32B 15/01* (2013.01); *B82Y 30/00* (2013.01); *C23C 28/023* (2013.01); *H01L 23/3733* (2013.01); *H01L 23/3736* (2013.01); *H01L 2924/0002* (2013.01); *Y10T 428/12389* (2015.01)

(58) Field of Classification Search
CPC ........ H01L 23/373; B32B 15/00; B32B 15/14
USPC .................. 428/608, 634, 668–675
See application file for complete search history.

(56) References Cited

U.S. PATENT DOCUMENTS

| | | | |
|---|---|---|---|
| 2003/0106676 A1* | 6/2003 | Bishop et al. ................. | 165/133 |
| 2008/0008870 A1 | 1/2008 | Sato et al. | |
| 2012/0031644 A1* | 2/2012 | Maxwell et al. ........... | 174/126.1 |

FOREIGN PATENT DOCUMENTS

| | | |
|---|---|---|
| JP | 2005-089836 | 4/2005 |
| JP | 2005-320579 | 11/2005 |
| JP | 2006-028636 | 2/2006 |
| JP | 2006-169609 | 6/2006 |
| JP | 2010-192661 | 9/2010 |

OTHER PUBLICATIONS

English Machine Translation of Kawai (JP 2010-192661), JPO, Accessed Jul. 8, 2014.*
Kim et al., "Strengthening of copper matrix composites by nickel-coated single-walled carbon nanotube reinforcements", Dec. 23, 2008, Synthetic Metals, vol. 159, pp. 424-429.*

* cited by examiner

*Primary Examiner* — Humera Sheikh
*Assistant Examiner* — Lucas Wang
(74) *Attorney, Agent, or Firm* — IPUSA, PLLC

(57) ABSTRACT

A heat radiating component includes a base including a first metal, a first plating layer formed on the base and including a second metal and carbon material structures dispersed in the second metal, and a second plating layer formed on the first plating layer. The first plating layer includes protruding parts that are parts of the carbon material structures protruding from a surface of the second metal. The second plating layer is formed on the first plating layer to cover surfaces of the protruding parts and the surface of the second metal without filling spaces between the protruding parts.

6 Claims, 7 Drawing Sheets

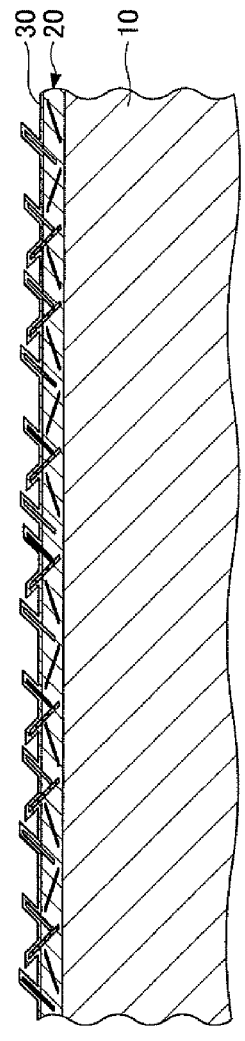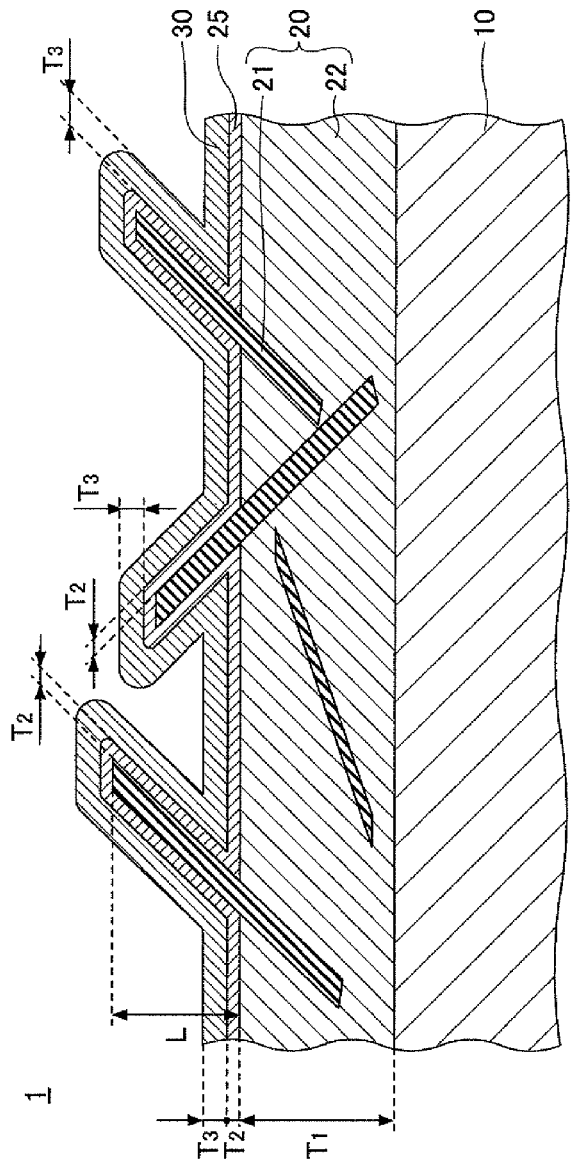

Ni

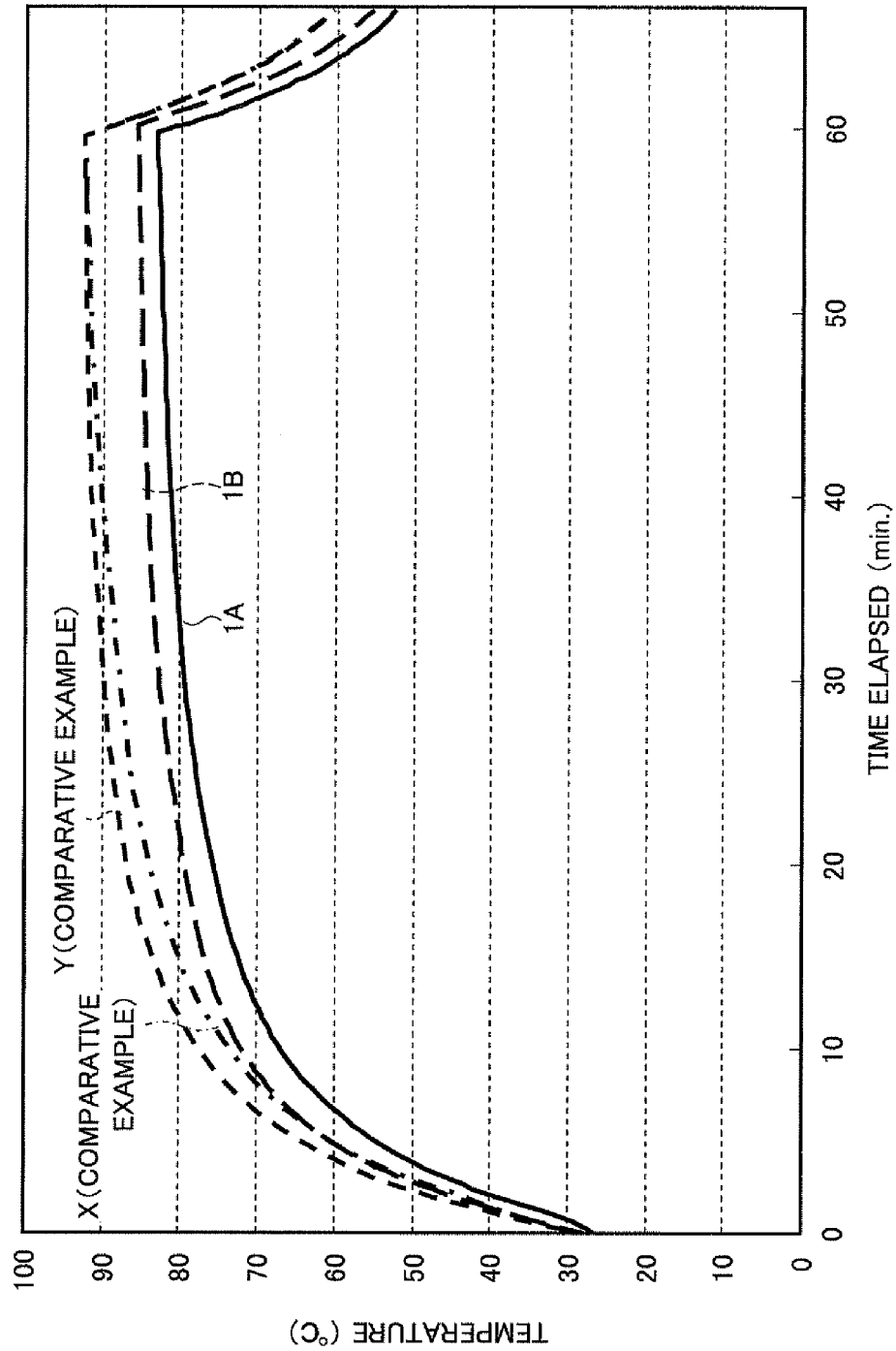

HEAT RADIATING COMPONENT AND METHOD OF PRODUCING SAME

CROSS-REFERENCE TO RELATED APPLICATIONS

This application is based upon and claims the benefit of priority of Japanese Patent Application No. 2010-205631 filed on Sep. 14, 2010 and Japanese Patent Application No. 2011-170156 filed on Aug. 3, 2011, the entire contents of which are incorporated herein by reference.

FIELD

The embodiments discussed herein are related to a heat radiating component and a method of producing the heat radiating component.

BACKGROUND

A semiconductor device used, for example, for a central processing unit (CPU) reaches a high temperature during its operation. To maintain the performance of such a semiconductor device, it is important to quickly release heat from the semiconductor device into external space.

For this reason, a heat radiating component such as a heat spreader or a heat pipe is often attached to a semiconductor device to effectively release heat emitted by the semiconductor device into external space. Also, research is being conducted to improve the radiation performance (or heat radiation efficiency) of heat radiating components such as heat spreaders and heat pipes. Particularly, various technologies for plating the surfaces of heat radiating components such as heat spreaders and heat pipes have been disclosed.

For example, Japanese Laid-Open Patent Publication No. 2006-28636 discloses a composite plating layer with a high thermal emittance (or heat radiation efficiency). The disclosed composite plating layer is formed using a plating solution including water, nickel sulfate, nickel chloride, boric acid, a brightener, a surfactant, and carbon nanofibers where polyacrylic acid is used as the surfactant.

Japanese Laid-Open Patent Publication No. 2005-089836 discloses a heat radiating component including a metal part and a composite plating layer formed on the metal part. The composite plating layer includes carbon nanofibers and a plating metal and is formed by electrolytic plating using an electrolytic plating solution where the carbon nanofibers are dispersed. A part of the carbon nanofibers forming the surface of the composite plating layer is exposed without being covered by the plating metal. JP2005-089836 also discloses etching the composite plating layer formed on the surface of the metal plate to remove the plating metal in the composite plating layer and thereby to increase the amount of the carbon nanofibers exposed on the composite plating layer.

Japanese Laid-Open Patent Publication No. 2006-169609 discloses a plating solution including a metal source and carbon particles such as carbon black, carbon nanotubes, ketjen black, or graphite. The average diameter of the carbon particles is less than or equal to 1 µm. When used for surface treatment of a contact member, the disclosed plating solution reduces the contact resistance of the contact member and also prevents foreign substances from adhering to the contact member. JP2006-169609 also discloses a contact member having a particle-containing-metal layer including carbon particles. According to JP2006-169609, the carbon particles are preferably exposed on the surface of the particle-containing-metal layer. Further, JP2006-169609 discloses that a metal plating layer may be formed on the surface of the particle-containing-metal layer and the carbon particles are preferably exposed on the surface of the metal plating layer.

Japanese Laid-Open Patent Publication No. 2005-320579 discloses an agglomerated particulate matter formed by carbon nanotubes. A metal plating layer is formed on at least a part of the surface of each of the carbon nanotubes. The carbon nanotubes are bonded to each other via the metal plating layers and the ends of the carbon nanotubes are not exposed and do not protrude from the agglomerated particulate matter.

Thus, various technologies for plating the surfaces of heat radiating components such as heat spreaders and heat pipes have been disclosed and many of the disclosed technologies use carbon materials such as carbon nanofibers.

To improve the heat radiation efficiency of a heat radiating component, it is necessary to increase the amount of carbon materials such as carbon nanofibers on the surface of a metal part constituting the heat radiating component.

However, with the technology disclosed in JP2006-028636, it is difficult to sufficiently improve the heat radiation efficiency. This is because even if the amount of carbon nanofibers dispersed in a plating solution is increased, some of the carbon nanofibers fall off during an ultrasonic vibration process. For example, if the carbon nanofibers on the surface of a metal part are completely removed by ultrasonic vibration, the heat radiation efficiency is reduced to one half of that before the carbon nanofibers are removed.

With the technology disclosed in JP2005-089836, the composite plating layer formed on the surface of the metal plate is etched to remove the plating metal in the composite plating layer and thereby to increase the amount of carbon nanofibers exposed on the composite plating layer. However, since a certain amount of the carbon nanofibers fall off during the etching process, it is difficult to increase the amount of carbon nanofibers exposed on the surface of the composite plating layer as desired.

With the technology disclosed in JP2006-169609, the carbon particles are exposed on the surface of the particle-containing-metal layer or on the surface of the metal plating layer formed on the particle-containing-metal layer. With this configuration, similarly to the configurations disclosed in JP2006-028636 and JP2005-089836, the carbon particles may easily fall off from the surface. Also, although the disclosed plating solution reduces the contact resistance and prevents adhesion of foreign substances, it is not clear whether the disclosed plating solution improves the heat radiation efficiency.

Further, since the carbon particles are not hydrophilic, it is difficult to reliably form the metal plating layer on the particle-containing-metal layer, so that the adhesion between the two layers tends to become low.

With the technology disclosed in JP2005-320579, it is difficult to sufficiently improve the heat radiation efficiency because the carbon nanotubes are completely covered by the metal plating layer.

Meanwhile, Japanese Laid-Open Patent Publication No. 2010-192661 discloses a technology where a composite plating layer including a metal and carbon nanotubes dispersed in the metal is formed and the composite plating layer is heated to melt the metal so that the surfaces of the carbon nanotubes are coated with the metal due to the capillary action. Here, the melting point of a metal is generally high. For example, the melting point of nickel (Ni) is about 1455° C., the melting point of iron (Fe) is about 1535 ° C., the melting point of copper (Cu) is about 1084 ° C., and the melting point of aluminum (Al) is about 660 ° C. Therefore, when, for example, nickel (Ni) is used as the metal, it is necessary to heat the composite plating layer to a temperature of about 1455° C. or higher. Also, this makes it necessary to use a material with a melting point higher than that of the metal for a radiator plate used as the base. Thus, the disclosed technology imposes constraints on a production process and selection of materials and is therefore difficult to implement.

SUMMARY

According to an aspect of this disclosure, there is provided a heat radiating component that includes a base including a first metal, a first plating layer formed on the base and including a second metal and carbon material structures dispersed in the second metal, and a second plating layer formed on the first plating layer. The first plating layer includes protruding parts that are parts of the carbon material structures protruding from a surface of the second metal. The second plating layer is formed on the first plating layer to cover surfaces of the protruding parts and the surface of the second metal without completely filling spaces between the protruding parts.

The object and advantages of the invention will be realized and attained by means of the elements and combinations particularly pointed out in the claims.

It is to be understood that both the foregoing general description and the followed detailed description are exemplary and explanatory and are not restrictive of the invention as claimed.

BRIEF DESCRIPTION OF DRAWINGS

FIG. 1 is a cut-away side view of a heat radiating component;

FIG. 2 is an enlarged view of a part of the heat radiating component illustrated in FIG. 1;

FIG. 6 is a graph illustrating heat radiation efficiency of heat radiating components.

DESCRIPTION OF EMBODIMENTS

Figure 3:
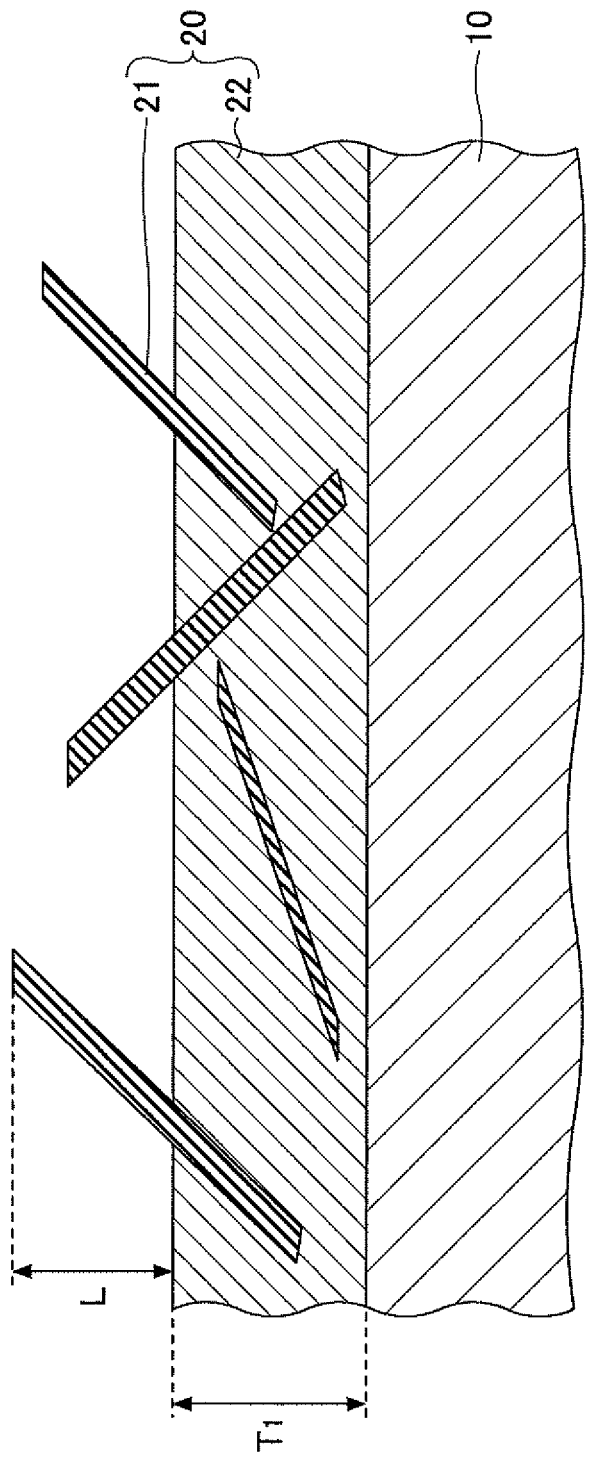
FIG. 3 is a drawing used to describe an exemplary process of producing a heat radiating component.

Preferred embodiments of the present invention are described below with reference to the accompanying drawings. Throughout the accompanying drawings, the same reference numbers are used for the same components, and overlapping descriptions of those components are omitted.

<Configuration of Heat Radiating Component>

An exemplary configuration of a heat radiating component 1 according to an embodiment is described below. FIG. 1 is a cut-away side view of the heat radiating component 1. FIG. 2 is an enlarged view of a part of the heat radiating component 1 illustrated in FIG. 1. Referring to FIGS. 1 and 2, the heat radiating component 1 includes a base 10, a first plating layer 20, a catalyst layer 25, and a second plating layer 30. In FIG. 1, the catalyst layer 25 is omitted for brevity.

The first plating layer 20, the catalyst layer 25, and the second plating layer 30 are stacked on the base 10. The base 10 is preferably made of a metal with good thermal conductivity. For example, copper (Cu), iron (Fe), or an alloy of copper and iron may be used for the base 10.

The first plating layer 20 is formed on the base 10 and is a composite plating layer including a metal 22 and carbon nanotubes (carbon material structures) 21 dispersed in the metal 22. The first plating layer 20 has a thickness $T_1$, for example, from about 10 μm to about 20 μm. The carbon nanotubes 21 are oriented in random directions with respect to the surface of the base 10. Parts of the carbon nanotubes 21 protrude from the surface of the metal 22.

Hereafter, the parts of the carbon nanotubes protruding from the surface of the metal 22 are called "protruding parts". An amount of protrusion L of the protruding parts of the carbon nanotubes 21 from the surface of the metal 22 may be, for example, about 10 μm. However, the amount of protrusion L may differ from one carbon nanotube 21 to another. The projected area of the protruding parts of the carbon nanotubes 21 may be, for example, 3% or more of the surface area of the first plating layer 20.

The diameter of the carbon nanotubes 21 may be, for example, from about 100 nm to about 300 nm. The length of the carbon nanotubes 21 may be, for example, from about 10 μm to about 15 μm. The number of the carbon nanotubes 21 may be, for example, several tens of thousands.

The metal 22 is preferably selected from metals that have good thermal conductivity and do not rust easily. For example, nickel (Ni), copper (Cu), cobalt (Co), gold (Au), or silver (Ag) may be used for the metal 22.

The carbon nanotubes 21 may be replaced with another carbon material such as carbon nanofibers, graphite, or carbon black. Also, a mixture of two or more carbon materials may be used instead of the carbon nanotubes 21.

The catalyst layer 25 is formed to cover the surface of the first plating layer 20 (i.e., the surfaces of the protruding parts of the carbon nanotubes 21 and the metal 22). The catalyst layer 25 is made of a catalytic material that is applied as a catalyst before the second plating layer 30 is formed.

The thickness of the catalyst layer 25 is controlled so as not to fill the spaces between the adjacent protruding parts of the carbon nanotubes 21.

For example, palladium (Pd) may be used as the material of the catalyst layer 25. Also, silver (Ag) or Sn/Pd (a mixture of tin and palladium) may be used as the material of the catalyst layer 25. Although the effect of the catalyst layer 25 is not influenced by its thickness, a thickness $T_2$ of the catalyst layer 25 may be, for example, from about 10 nm to about 40 nm. The catalyst layer 25 is an example of a third metal layer in the present application.

The second plating layer 30 is formed to cover the surface of the catalyst layer 25 (i.e., the surfaces of the protruding parts of the carbon nanotubes 21 and the metal 22 on which the catalyst layer 25 is formed). The second plating layer 30 is provided to prevent the protruding parts of the carbon nanotubes 21 from falling off. If the second layer 30 is formed to cover the protruding parts of the carbon nanotubes 21 collectively, the heat radiation efficiency of the heat radiating component 1 may be reduced. Therefore, the thickness of the second plating layer 30 is controlled so as not to fill the spaces between the adjacent protruding parts of the carbon nanotubes 21 on which the catalyst layer 25 is formed.

Here, it is not essential to uniformly form the catalyst layer 25 and the second plating layer 30 on the surfaces of the protruding parts of the carbon nanotubes 21 and the metal 22. For example, some parts of the surfaces of the protruding parts of the carbon nanotubes 21 and the metal 22 may be uncovered by the catalyst layer 25 and may be covered directly by the second plating layer 30. Even if there are such parts, as long as the surfaces of the protruding parts of the carbon nanotubes 21 and the metal 22 are mostly covered by the catalyst layer 25 and the second plating layer 30, it does not greatly affect the heat radiation efficiency.

Since carbon materials like the carbon nanotubes 21 are generally not hydrophilic, the adhesion between the carbon nanotubes 21 and the catalyst layer 25 tends to be low. For this reason, the first plating layer 20 is made hydrophilic by surface treatment and the catalyst layer 25 is formed on the surface-treated first plating layer 20. Details of the surface treatment are described later.

The second plating layer 30 may be formed by electrolytic plating using, for example, nickel (Ni). When the second plating layer 30 is formed by electrolytic plating using nickel (Ni), a thickness $T_3$ of the second plating layer 30 is preferably greater than or equal to about 0.5 μm and less than or equal to about 2 μm. If the thickness $T_3$ of the second plating layer 30 is less than about 0.5 μm, it may become difficult to prevent the carbon nanotubes 21 from falling off. Meanwhile, if the thickness $T_3$ of the second plating layer 30 is greater than about 2 μm, the heat radiation efficiency may be reduced.

Alternatively, the second plating layer 30 may be formed by electrolytic plating using copper (Cu) or silver (Ag). When the second plating layer 30 is formed by electrolytic plating using copper (Cu) or silver (Ag), the thickness $T_3$ of the second plating layer 30 is preferably greater than or equal to about 0.5 μm and less than or equal to about 2 μm. If the thickness $T_3$ of the second plating layer 30 is less than about 0.5 μm, it may become difficult to prevent the carbon nanotubes 21 from falling off. Meanwhile, if the thickness $T_3$ of the second plating layer 30 is greater than about 2 μm, the heat radiation efficiency may be reduced.

The heat radiating component 1 may be applied, for example, to a vapor chamber, a heat pipe, a heat spreader, and a housing of a light-emitting diode (LED). The base 10 of the heat radiating component 1 is attached to a heat generator such as a semiconductor device, and the base 10 quickly transfers the heat generated by the semiconductor device to the surface of the first plating layer 20. In the first plating layer 20, the protruding parts of the carbon nanotubes 21 protrude from the metal 22. Since the protruding parts of the carbon nanotubes 21 are covered by the catalyst layer 25 and the second plating layer 30 that are very thin, the heat transferred from the base 10 is immediately released from the protruding parts of the carbon nanotubes 21. Covering the protruding parts of the carbon nanotubes 21 with the catalyst layer 25 and the second plating layer 30 makes it possible to improve the heat radiation efficiency of the first plating layer 20. Also, covering the protruding parts of the carbon nanotubes 21 with the catalyst layer 25 and the second plating layer 30 makes it possible to prevent the protruding parts from falling off and thereby makes it possible to prevent the reduction in the heat radiation efficiency.

<Method of Producing Heat Radiating Component>

Figure 4:
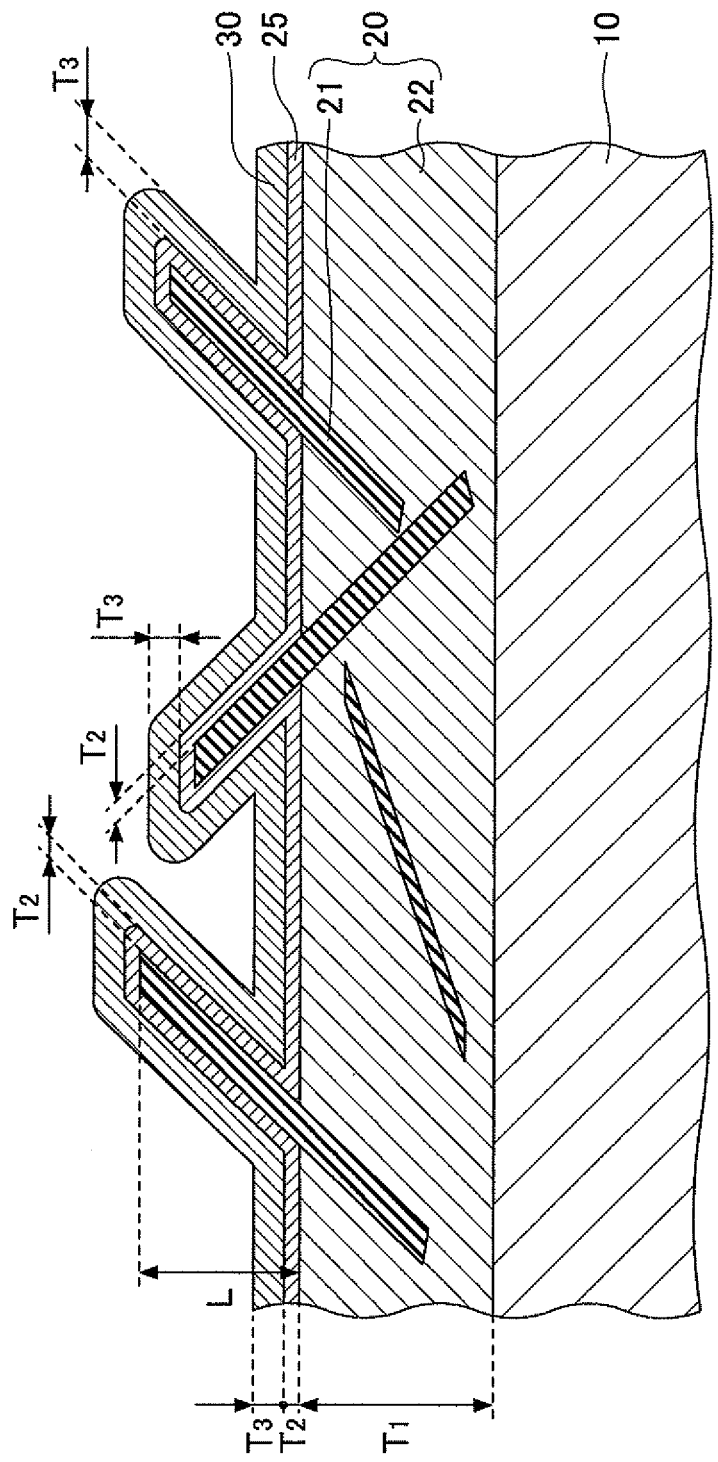
FIG. 4 is another drawing used to describe an exemplary process of producing a heat radiating component.

An exemplary method of producing the heat radiating component 1 is described below. FIGS. 3 and 4 are drawings used to describe an exemplary method of producing the heat radiating component 1. First, as illustrated in FIG. 3, the base 10 is prepared. The base 10 is preferably made of a metal with good thermal conductivity. For example, copper (Cu), iron (Fe), or an alloy of copper and iron may be used for the base 10.

Next, the first plating layer 20, which is a composite plating layer, is formed on the surface of the base 10 by electrolytic plating using an electrolytic plating solution including the metal 22 and the carbon nanotubes 21 dispersed in the metal 22.

The first plating layer 20 is formed such that parts of the carbon nanotubes 21 protrude from the surface of the metal 22.

The thickness $T_1$ of the first plating layer 20 is, for example, from about 10 μm to about 20 μm. The amount of protrusion L of the protruding parts of the carbon nanotubes 21 from the surface of the metal may be, for example, about 10 μm. However, the amount of protrusion L may differ from one carbon nanotube 21 to another. The projected area of the protruding parts of the carbon nanotubes 21 may be, for example, 3% or more of the surface area of the first plating layer 20. Other details of the carbon nanotubes and the metal 22 are described above and are therefore omitted here.

The electrolytic plating solution for the first plating layer 20 preferably includes a dispersing agent such as polyacrylic acid for dispersing the carbon nanotubes 21. The electrolytic plating solution may also include a brightener such as an alkane diol compound, an alkene diol compound, or an alkyne diol compound. Particularly, an alkyne diol compound including alkyne diol molecules having oxyethylene side chains is preferably used as the brightener. The amount of oxyethylene side chains is preferably greater than or equal to 20 weight percent and less than or equal to 85 weight percent of the molecular weight of the alkyne diol compound.

The electrolytic plating solution may further include a surfactant such as an organic compound having a ketone group, an aldehyde group, or a carboxylic acid group; a carbon monoxide compound; a coumarin derivative, sulfonated allyl aldehyde; a sulfone compound having an allyl group; alkylene carboxy ester; alkylene aldehyde; an acetylene derivative; pyridinium compound; an alkane sulfone compound; or an azo compound. To disperse the carbon nanotubes 21 in the electrolytic plating solution as described above, the carbon nanotubes 21 are preferably immersed in a dispersing agent solution beforehand to improve the dispersiveness and then mixed into the electrolytic plating solution.

The amount of the carbon nanotubes 21 mixed into the electrolytic plating solution is preferably greater than or equal to 100 ppm, more preferably greater than or equal to 500 ppm, and still more preferably greater than or equal to 1000 ppm. The upper limit of the amount of the carbon nanotubes 21 mixed into the electrolytic plating solution is preferably about 1 weight percent. If the amount of the carbon nanotubes 21 exceeds 1 weight percent, it may become difficult to disperse the carbon nanotubes 21 in the electrolytic plating solution.

Electrolytic plating using the electrolytic plating solution including the dispersed carbon nanotubes 21 is preferably performed while agitating the electrolytic plating solution at a current density of less than or equal to about 5 A/dm² to maintain the dispersion state of the carbon nanotubes 21. If the electrolytic plating is performed at a current density of greater than about 5 A/dm², the surface of the first plating layer 20 tends to become rough.

The base 10 is connected to the cathode of a direct-current power supply (not shown) and is held in a position perpendicular to the surface of the electrolytic plating solution, and an anode plate (not shown) connected to the anode of the direct current power supply is positioned to face a surface (which is to be plated) of the base 10. The electrolytic plating is performed while swinging the base 10 and the anode plate in the horizontal directions so that the carbon nanotubes 21 are evenly arranged on the surface of the base 10 and parts of the carbon nanotubes 21 protrude from the surface of the metal 22.

Next, before forming the catalyst layer 25, surface treatment is performed on the first plating layer 20. The carbon nanotubes 21 are not hydrophilic and therefore the adhesion between the protruding parts of the carbon nanotubes 21 and the catalyst layer 25 tends to be low. The surface treatment is performed on the first plating layer 20 to make the protruding parts of the carbon nanotubes 21 hydrophilic and thereby to improve the adhesion with the catalyst layer 25. For the surface treatment, for example, a surfactant that consists primarily of 2-aminoethanol, polyoxyethylene-octylphenyl ether is preferably used.

Referring to FIG. 4, the catalyst layer 4 is formed on the surface-treated first plating layer 20 to cover the surfaces of the protruding parts of the carbon nanotubes 21 and the metal 22. The thickness of the catalyst layer 25 is controlled so as not to fill the spaces between the adjacent protruding parts of the carbon nanotubes 21. Next, the second plating layer 30 is formed by electrolytic plating on the catalyst layer 25 covering the surfaces of the protruding parts of the carbon nanotubes 21 and the metal 22. The thickness of the second plating layer 30 is controlled so as not to fill the spaces between the adjacent protruding parts of the carbon nanotubes 21 covered by the catalyst layer 25.

As the material of the catalyst layer 25, for example, palladium (Pd) may be used. Also, silver (Ag) or Sn/Pd (a mixture of tin and palladium) may be used as the material of the catalyst layer 25. Although the effect of the catalyst layer 25 is not influenced by its thickness, the thickness $T_2$ of the catalyst layer 25 may be, for example, from about 10 nm to about 40 nm.

As the material of the second plating layer 30, for example, nickel (Ni) may be used. When nickel (Ni) is used for the second plating layer 30, the thickness $T_3$ of the second plating layer 30 is preferably greater than or equal to about 0.5 μm and less than or equal to about 2 μm. If the thickness $T_3$ of the second plating layer 30 is less than about 0.5 μm, it may become difficult to prevent the carbon nanotubes 21 from falling off. Meanwhile, if the thickness $T_3$ of the second plating layer 30 is greater than about 2 μm, the heat radiation efficiency may be reduced.

Alternatively, copper (Cu) or silver (Ag) may be used for the second plating layer 30. When copper (Cu) or silver (Ag) is used for the second plating layer 30, the thickness $T_3$ of the second plating layer 30 is preferably greater than or equal to about 0.5 μm and less than or equal to about 2 μm. If the thickness $T_3$ of the second plating layer 30 is less than about 0.5 μm, it may become difficult to prevent the carbon nanotubes 21 from falling off. Meanwhile, if the thickness $T_3$ of the second plating layer 30 is greater than about 2 μm, the heat radiation efficiency may be reduced.

In the above process, an acid immersion step may be performed before the step of forming the catalyst layer 25 and a reduction treatment step may be performed between the step of forming the catalyst layer 25 and the step (electrolytic plating step) of forming the second plating layer 30. The acid immersion step activates the plated surface so that the catalyst layer 25 more stably (or easily) adheres to the plated surface. For example, a solution consisting essentially of hydrochloric acid may be used for the acid immersion step. The reduction treatment step reduces and thereby metallizes the catalytic material (a substance forming the catalytic layer 25) applied to the plated surface. For example, a solution consisting essentially of sodium hypophosphite, which is a reducing agent, may be used for the reduction treatment step.

Thus, the heat radiating component 1 may be produced through the process as described above with reference to FIGS. 3 and 4.

As described above, according to an embodiment, the first plating layer 20 is formed on the base 10 such that the carbon nanotubes 1 are oriented in random directions with respect to the surface of the base 10 and parts of the carbon nanotubes 21 protrude from the surface of the metal 22. After surface treatment is performed on the first plating layer 20, the catalyst layer 25 and the second plating layer 30 are formed in this order on the first plating layer 20. The thicknesses of the catalyst layer 25 and the second plating layer 30 are controlled so as not to fill the spaces between the adjacent protruding parts of the carbon nanotubes 21. In the heat radiating component 1 produced as described above, the carbon nanotubes 21 with excellent thermal properties such as a high thermal conductivity are disposed in the metal 22 with excellent thermal properties such as a high thermal conductivity. This configuration makes it possible to quickly transmit heat from the surface of the base 10 to the surface of the first plating layer 20 and thereby makes it possible to improve the heat radiation efficiency.

Also in the heat radiating component 1, parts (protruding parts) of the carbon nanotubes 21 protrude from the surface of the metal 22 and the protruding parts are covered with the catalyst layer 25 and the second plating layer 30 that are extremely thin. This configuration allows the heat transmitted from the base 10 to be immediately released from the protruding parts of the carbon nanotubes 21 and thereby makes it possible to improve the heat radiation efficiency of the first plating layer 20.

Further, covering the protruding parts of the carbon nanotubes 21 with the catalyst layer 25 and the second plating layer 30 makes it possible to prevent the protruding parts of the carbon nanotubes 21 from falling off and thereby makes it possible to prevent the reduction in the heat radiation efficiency.

<Variation>

In the above embodiment, the second plating layer 30 is formed by electrolytic plating. In this variation, the second plating layer 30 is formed by electroless plating. In this variation, descriptions overlapping those in the above embodiment are omitted.

Similar to the above embodiment, the base 10 is prepared, the first plating layer 20 is formed on the base 10, and surface treatment is performed on the first plating layer 20 before the catalytic layer 25 is formed.

Next, the catalyst layer 25 is formed on the surface-treated first plating layer 20 to cover the surfaces of the protruding parts of the carbon nanotubes 21 and the metal 22. The thickness of the catalyst layer 25 is controlled so as not to fill the spaces between the adjacent protruding parts of the carbon nanotubes 21. Then, the second plating layer 30 is formed by electroless plating on the catalyst layer 25 covering the surfaces of the protruding parts of the carbon nanotubes 21 and the metal 22. The thickness of the second plating layer 30 is controlled so as not to fill the spaces between the adjacent protruding parts of the carbon nanotubes 21 covered by the catalyst layer 25.

As the material of the second plating layer 30, for example, nickel-phosphorus (Ni—P) may be used. When Ni—P is used for the second plating layer 30, the thickness $T_3$ of the second plating layer 30 is preferably greater than or equal to about 0.5 μm and less than or equal to about 2 μm. If the thickness $T_3$ of the second plating layer 30 is less than about 0.5 μm, it may become difficult to prevent the carbon nanotubes 21 from falling off. Meanwhile, if the thickness $T_3$ of the second plating layer 30 is greater than about 2 μm, the heat radiation efficiency may be reduced.

In the above process, an acid immersion step may be performed before the step of forming the catalyst layer 25 and a reduction treatment step may be performed between the step of forming the catalyst layer 25 and the step (electroless plating step) of forming the second plating layer 30. The acid immersion step activates the plated surface so that the catalyst layer 25 more stably (or easily) adheres to the plated surface. For example, a solution consisting essentially of sodium hydrogensulfate and sulfuric acid may be used for the acid immersion step. The reduction treatment step reduces and thereby metallizes the catalytic material (a substance forming the catalytic layer 25) applied to the plated surface. For example, a solution consisting essentially of dimethylamineborane, which is a reducing agent, may be used for the reduction treatment step. In this case, the electroless plating step is performed after the reduction treatment step. Thus, the second plating layer 30 may be formed by electroless plating.

The heat radiating component 1 produced by the process of this variation also provides advantageous effects as described in the above embodiment.

EXAMPLE 1

The heat radiating component 1 (hereafter called a heat radiating component 1A) was produced by the production method of the above embodiment. In example 1, the base 10 was prepared using copper (Cu), and the first plating layer 20 (thickness $T_1=10$ μm) including the metal 22 and the carbon nanotubes 21 dispersed in the metal 22 was formed by electrolytic plating on the base 10. As the metal 22, nickel (Ni) was used.

Next, surface treatment was performed on the first plating layer 20, and the catalyst layer 25 (thickness $T_2=10\text{-}40$ nm) was formed on the surface-treated first plating layer 20 to cover the surfaces of the protruding parts of the carbon nanotubes 21 and the metal 22. As the material of the catalyst layer 25, palladium (Pd) was used. As a result of observation with a scanning transmission electron microscope (STEM), it was confirmed that the catalyst layer 25 (palladium) was formed on the surface of the first plating layer 20.

Next, the second plating layer 30 (thickness $T_3=2$ μm) was formed by electrolytic plating on the catalyst layer 25 covering the surfaces of the protruding parts of the carbon nanotubes 21 and the metal 22. As the material of the second plating layer 30, nickel (Ni) was used.

As a comparative example, a heat radiating component W was produced. In producing the heat radiating component W, the first plating layer 20 was formed on the base 10, surface treatment was performed on the first plating layer 20, and the second plating layer 30 (thickness $T_3=2$ μm) was formed by electrolytic plating directly on the surfaces of the protruding parts of the carbon nanotubes 21 and the metal 22 without forming the catalyst layer 25 (palladium). As the material of the second plating layer 30, nickel (Ni) was used. Thus, the heat radiating component W (comparative example) is different from the heat radiating component 1A (embodiment) only in that the catalyst layer 25 (palladium) is not formed.

Deposition of nickel (Ni) on the heat radiating component 1A (embodiment) and the heat radiating component W (comparative example) was observed using a scanning electron microscope (SEM).

Figure 5A:
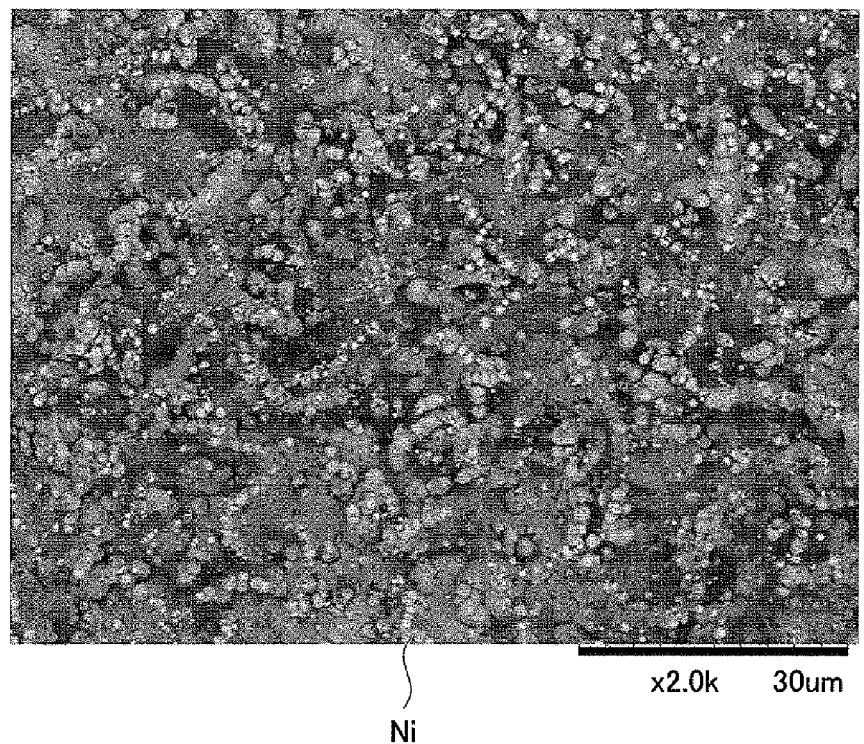
FIG. 5A is a SEM photograph of a heat radiating component of a comparative example.
Figure 5B:
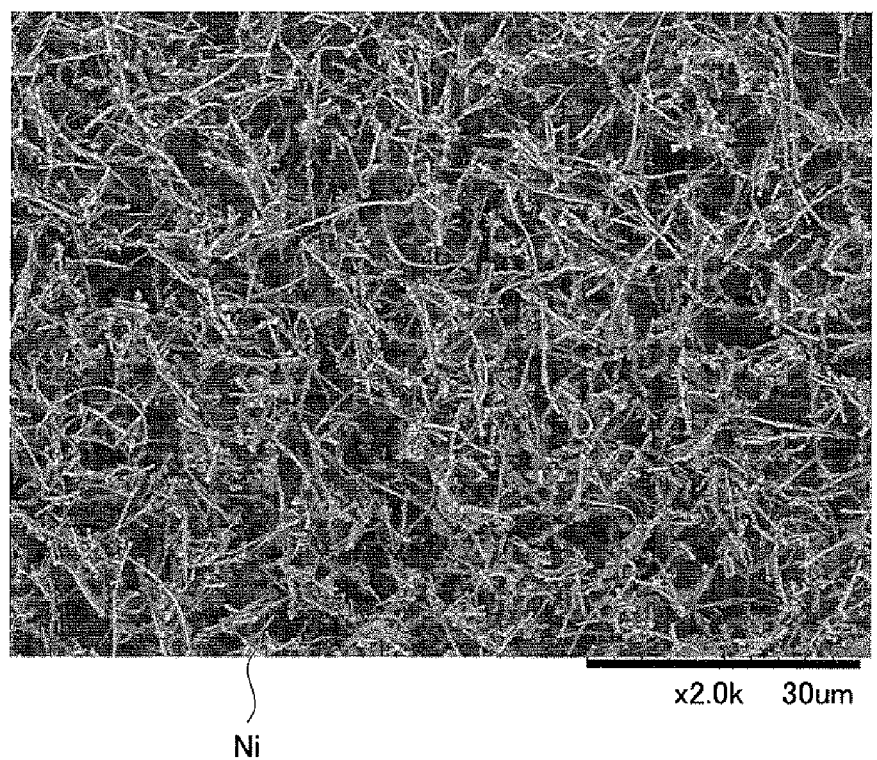
FIG. 5B is a SEM photograph of a heat radiating component according to an embodiment.
Figure 5C:
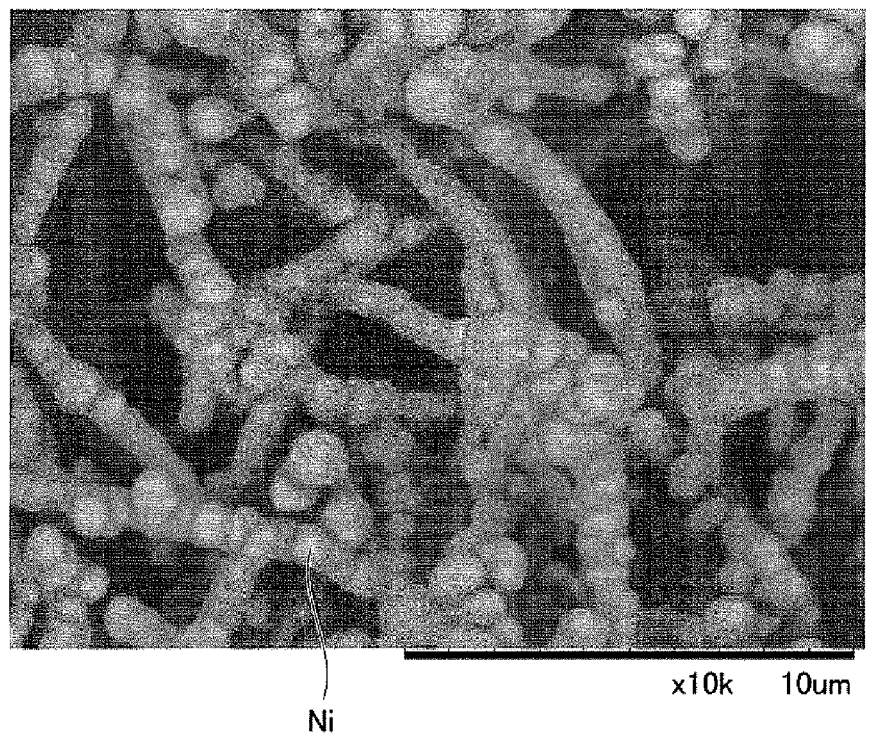
FIG. 5C is an enlarged photograph of a part of FIG. 5B.

The results are shown in FIGS. 5A through 5C. FIG. 5A is a SEM photograph (magnification: 2000×) representing the surfaces of the protruding parts of the carbon nanotubes 21 and the metal 22 of the heat radiating component W (comparative example). FIG. 5B is a SEM photograph (magnification: 2000×) representing the surfaces of the protruding parts of the carbon nanotubes 21 and the metal 22 of the heat radiating component 1A (embodiment). FIG. 5C is an enlarged photograph (magnification: 10000×) of a part of FIG. 5B.

As is apparent from FIG. 5A, nickel (Ni) is deposited like balls on the heat radiating component W (comparative example) that does not include the catalyst layer 25 (palladium). Also in FIG. 5A, at many positions on the heat radiating component W, nickel (Ni) is not present and the surfaces of the protruding parts of the carbon nanotubes 21 are exposed Referring to FIGS. 5B and 5C, unlike the heat radiating component W (comparative example) of FIG. 5A, nickel (Ni) is uniformly deposited on the heat radiating component 1A (embodiment) including the catalyst layer 25 (palladium). Also, the surfaces of the protruding parts of the carbon nanotubes 21 are almost completely covered by nickel (Ni) and are not exposed. At least, exposed portions of the protruding parts are far less than those on the heat radiating component W (comparative example).

Thus, forming the catalyst layer 25 before forming the second plating layer 30 makes it possible to uniformly deposit the second plating layer 30.

Although the second plating layer 30 was formed by electrolytic plating in example 1, nickel (Ni) was also deposited uniformly in a case where the second plating layer 30 was formed by electroless plating.

EXAMPLE 2

The heat radiating component 1 (hereafter called a heat radiating component 1B) was produced by the production method of the above variation. In example 2, the base 10 was prepared using copper (Cu), and the first plating layer 20 (thickness $T_1=10$ μm) including the metal 22 and the carbon nanotubes 21 dispersed in the metal 22 was formed by electrolytic plating on the base 10. As the metal 22, nickel (Ni) was used. Next, surface treatment was performed on the first plating layer 20, and the catalyst layer 25 (thickness $T_2=10\text{-}40$ nm) was formed on the surface-treated first plating layer 20 to cover the surfaces of the protruding parts of the carbon nanotubes 21 and the metal 22. Next, the second plating layer 30 (thickness $T_3=2$ μm) was formed by electroless plating on the catalyst layer 25 covering the surfaces of the protruding parts of the carbon nanotubes 21 and the metal 22. As the material of the second plating layer 30, nickel-phosphorus (Ni—P) was used.

As comparative examples, a heat radiating component X and a heat radiating component Y were produced. The heat radiating component X includes only the base 10 made of copper (Cu). The heat radiating component Y includes the base 10 made of copper (Cu) and a nickel electrolytic plating layer (including no carbon nanotube) with a thickness of 10 μm formed on the base 10.

The heat radiating component 1A (embodiment), the heat radiating component 1B (variation), the heat radiating component X (comparative example), and the heat radiating component Y (comparative example) were mounted one by one on a block provided with a heater and a thermometer and for each of the heat radiating components, temperatures were measured with the thermometer while a constant voltage was applied to the heater for 60 minutes. FIG. 6 shows the results of this experiment. In FIG. 6, a smaller temperature rise after 60 minutes indicates higher heat radiation efficiency.

As illustrated in FIG. 6, with the heat radiating components X and Y (comparative examples), the temperature after 60 minutes was about 92° C. Meanwhile, with the heat radiating component 1A produced by the production method of the above embodiment, the temperature after 60 minutes was about 82° C. Thus, the temperature measured with the heat radiating component 1A was 10° C. lower than the temperature measured with the heat radiating components X and Y of the comparative examples. This indicates that the heat radiating component 1A has much higher heat radiation efficiency than the heat radiating components X and Y of the comparative examples.

With the heat radiating component 1B produced by the production method of the above variation, the temperature after 60 minutes was about 85° C. Thus, the temperature measured with the heat radiating component 1B was 7° C. lower than the temperature measured with the heat radiating components X and Y (comparative examples). This indicates the heat radiating component 1B has much higher heat radiation efficiency than the heat radiating components X and Y of the comparative examples.

As described above, an aspect of this disclosure makes it possible to provide a heat radiating component with improved heat radiation efficiency and a method of producing the heat radiating component.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. A heat radiating component, comprising:
   a base including a first metal;
   a first plating layer formed on the base and including a second metal and carbon material structures dispersed in the second metal; and
   a second plating layer formed on the first plating layer, wherein
   the first plating layer includes protruding parts that are parts of the carbon material structures protruding from a surface of the second metal; and
   the second plating layer is formed on the first plating layer to cover surfaces of only the protruding parts of the carbon material structures and the surface of the second metal without completely filling spaces between the protruding parts.

2. The heat radiating component as claimed in claim 1, further comprising:
   a third metal layer that covers the surfaces of the protruding parts and the surface of the second metal,
   wherein the second plating layer is formed to cover the third metal layer without completely filling the spaces between the protruding parts.

3. The heat radiating component as claimed in claim 2, wherein the third metal layer includes palladium.

4. The heat radiating component as claimed in claim 1, wherein the second plating layer includes nickel.

5. The heat radiating component as claimed in claim 1, wherein the surfaces of the protruding parts and the surface of the second metal of the first plating layer are made hydrophilic by surface treatment.

6. The heat radiating component as claimed in claim 1, wherein the carbon material structures include carbon nanotubes.

* * * * *